United States Patent
Kang et al.

(10) Patent No.: US 11,264,114 B2
(45) Date of Patent: Mar. 1, 2022

(54) TEST PATTERN GENERATOR AND METHOD FOR GENERATING TEST PATTERN

(71) Applicant: SK hynix Inc., Gyeonggi-do (KR)

(72) Inventors: Dong-Ho Kang, Seoul (KR); Jae-Han Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 129 days.

(21) Appl. No.: 16/725,699

(22) Filed: Dec. 23, 2019

(65) Prior Publication Data

US 2020/0335174 A1 Oct. 22, 2020

(30) Foreign Application Priority Data

Apr. 17, 2019 (KR) .................. 10-2019-0045103

(51) Int. Cl.
*G11C 29/36* (2006.01)

(52) U.S. Cl.
CPC ...... *G11C 29/36* (2013.01); *G11C 2029/3602* (2013.01)

(58) Field of Classification Search
CPC .................. G11C 29/36; G11C 2029/3602
See application file for complete search history.

(56) References Cited

U.S. PATENT DOCUMENTS

| | | |
|---|---|---|
| 5,729,554 A | 3/1998 | Weir et al. |
| 6,523,143 B1 | 2/2003 | Kobayashi |
| 9,690,514 B2 * | 6/2017 | Nakamura ............. G06F 3/064 |
| 9,923,578 B2 * | 3/2018 | Kim ...................... G06F 3/0619 |
| 10,606,515 B2 * | 3/2020 | Chun ..................... G06F 3/0629 |
| 2011/0307664 A1 * | 12/2011 | Paver ..................... G06F 12/121 711/128 |
| 2020/0320013 A1 * | 10/2020 | Seningen ............... G11C 5/144 |

OTHER PUBLICATIONS

Ugarte, I. et al., Optimized Coverage-directed Random Simulation, 2008, pp. 145-152, IEEE International High Level Design Validation and Test Workshop, NC, USA.

Mandouh, E.E et al., Automatic Generation of Functional Coverage Models, 2016, pp. 754-757, IEEE International Symposium on Circuit and Systems (ISCAS), QC, Canada.

Savir, J. et al., On Random Pattern Test Length, Transactions on Computers, Jun. 1984, pp. 467-474, vol. C-33, No. 6, IEEE.

Fiser, P., Pseudo-Random Pattern Generator Design for Column-Matching BIST, 2007, 10th Euromicro Conference on Digital System Design Architectures, Methods and Tools (DSD 2007), Lubeck, Germany.

* cited by examiner

*Primary Examiner* — Phung M Chung
(74) *Attorney, Agent, or Firm* — IP & T Group LLP

(57) ABSTRACT

A test pattern generator includes a random command address generator suitable for generating N combinations, each combination of a command and an address, where N is an integer greater than or equal to 2; an address converter suitable for converting the N combinations into an N-dimensional address; a history storage circuit which is accessed based on the N-dimensional address; and a controller suitable for classifying the N combinations as issue targets, when an area in the history storage circuit, which is accessed based on the N-dimensional address, indicates a value of no hit.

14 Claims, 3 Drawing Sheets

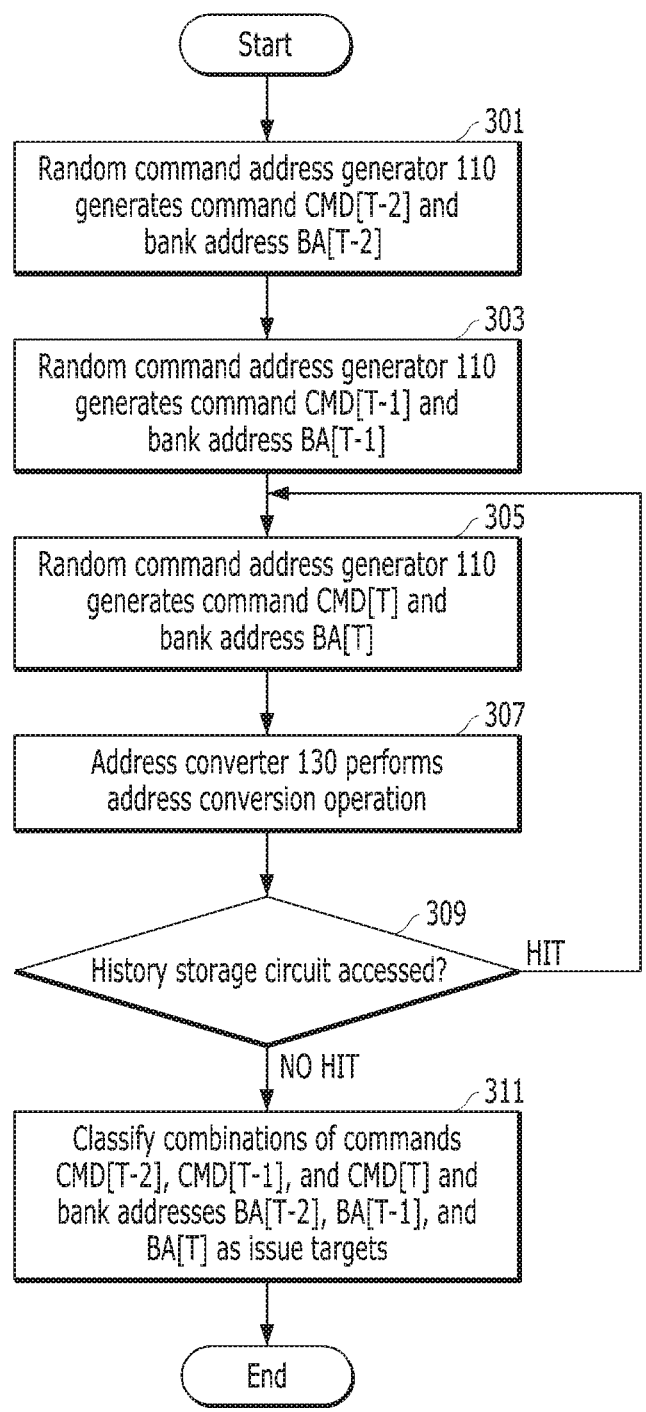

TEST PATTERN GENERATOR AND METHOD FOR GENERATING TEST PATTERN

CROSS-REFERENCE TO RELATED APPLICATIONS

The present application claims priority of Korean Patent Application No. 10-2019-0045103, filed on Apr. 17, 2019, which is incorporated herein by reference in its entirety.

BACKGROUND

1. Field

Various embodiments relate to a test pattern generator for generating a test pattern of a memory.

2. Description of the Related Art

As computing systems make progress, memory capacity is increasing and new functions are being added. For example, the number of command sets and the number of banks in a memory are increasing. When the types of command sets and the number of banks are increased, the number of test patterns that need to be verified may increase exponentially. For example, a low-power double data rate 5 (LPDDR5) memory has 60% more command sets than an LPDDR4 memory and twice as many banks as those of the LPDDR4 memory. The types of test patterns that need to be verified for testing an LPDDR5 memory may be hundreds of times greater than those for an LPDDR4 memory.

Test patterns are randomly generated when a memory is tested. As the test time increases, the probability that the test patterns overlap with each other may increase. That is, test patterns that have already been tested are highly likely to be tested again, therefore the test coverage may be saturated.

SUMMARY

Embodiments of the present invention are directed to a test pattern generator with decreased test pattern overlapping.

In accordance with an embodiment of the present invention, a test pattern generator includes: a random command address generator suitable for generating N combinations, each combination of a command and an address, where N is an integer greater than or equal to 2; an address converter suitable for converting the N combinations into an N-dimensional address; a history storage circuit which is accessed based on the N-dimensional address; and a controller suitable for classifying the N combinations as issue targets, when an area in the history storage circuit, which is accessed based on the N-dimensional address, indicates a value of no hit.

In accordance with another embodiment of the present invention, a test pattern generator includes: a random command address generator suitable for generating combinations, each combination being a command and a bank address, the combinations including first, second and third combinations; a pattern storage circuit suitable for storing the combinations; an address converter suitable for converting the first combination into a first-axis address, converting the second combination into a second-axis address, and converting the third combination into a third-axis address; a history storage circuit which is accessed based on the first-axis address, the second-axis address, and the third-axis address; and a controller suitable for controlling the first to third combinations to be stored in the pattern storage circuit as issue targets when an area in the history storage circuit, which is accessed based on the first-axis address, the second-axis address, and the third-axis address indicates a value of no hit.

In accordance with yet another embodiment of the present invention, a method for generating a test pattern includes: randomly generating N combinations, each combination being a command and an address, where N is an integer greater than or equal to 2; converting the N combinations into an N-dimensional address; accessing a history storage circuit based on the N-dimensional address; detecting whether an area in the history storage circuit, which is accessed based on the N-dimensional address, indicates a value of no hit; and classifying the N combinations as issue targets in response to the detection of no hit.

In accordance with still another embodiment of the present invention, a method for generating a test pattern includes: randomly generating N combinations, each combination being a command and a bank address, the N combinations including first, second and third combinations, where N is an integer greater than or equal to 2; converting the N combinations into an N-dimensional address; accessing a history storage circuit based on the N-dimensional address; detecting whether an area in the history storage circuit, which is accessed based on the N-dimensional address, indicates a value of no hit; and changing the N combinations in response to the detection of a value of hit.

In accordance with still another embodiment of the present invention, a test pattern generator includes: a random command generator suitable for selecting a current command at a current state and generating a combination of commands using the current command and previous commands at previous states; a history storage circuit suitable for storing histories for multiple combinations of commands; and a controller suitable for determining whether the generated combination of commands corresponds to one of the histories, generating the current command when it is determined that the generated combination of commands does not correspond to one of the histories, and generating another current command when it is determined that the generated combination of commands corresponds to one of the histories.

BRIEF DESCRIPTION OF THE DRAWINGS

FIG. 3 is a flowchart illustrating an operation of the test pattern generator 100 of FIG. 1.

DETAILED DESCRIPTION

Figure 1:
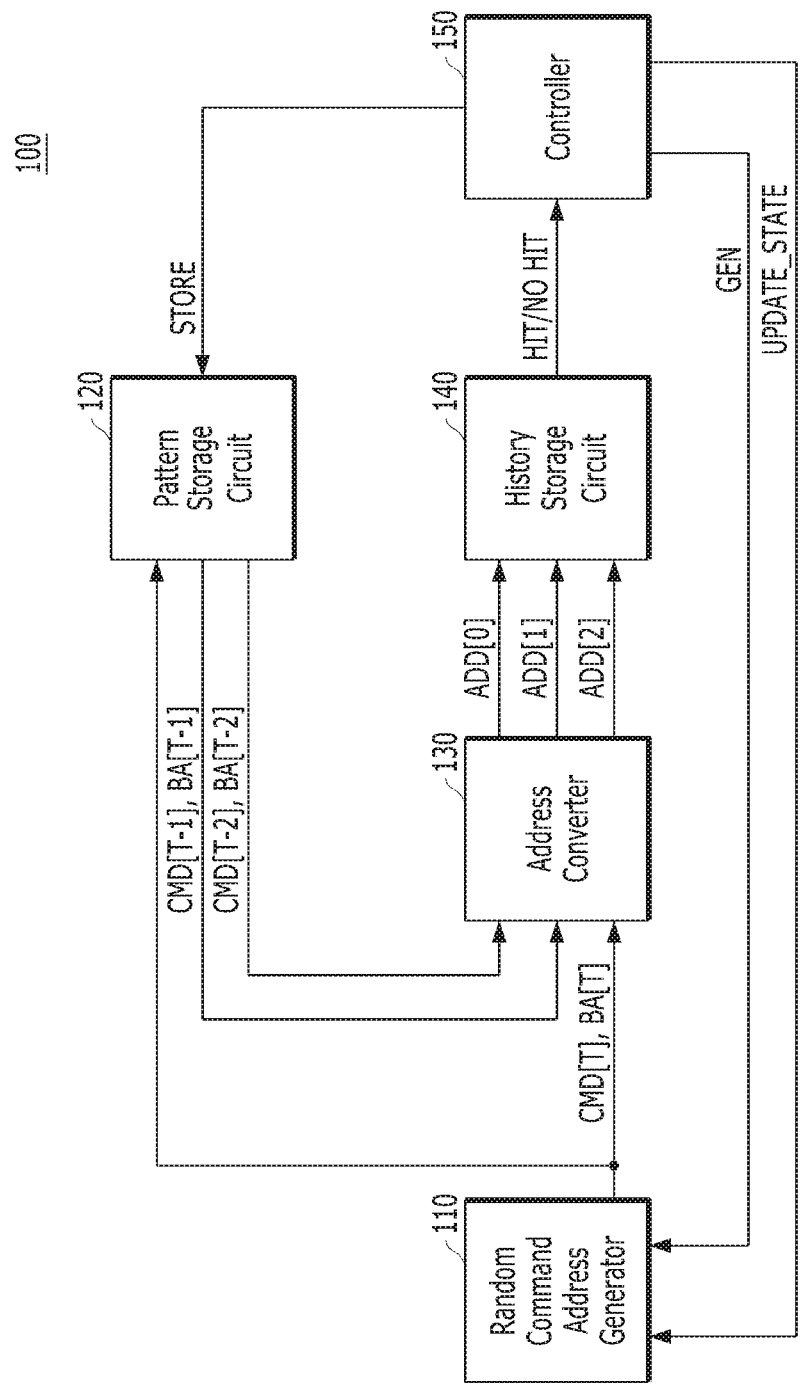
FIG. 1 is a block diagram illustrating a test pattern generator in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A test pattern may be a group of N consecutive combinations of commands and addresses (hereinafter referred to as command address combinations) (where N is an integer of 2 or more). Hereinafter, for convenience, it may be assumed that N is 3 (where N=3). When one of a command and a bank address among the three consecutive command address combinations is different, the test pattern may be another test pattern.

There are many types of commands used in a memory. Herein five types of commands will be described which include an active command ACT, a write command WR, a read command RD, a precharge command PRE, and a refresh command REF. However, number of types of commands may vary depending on design. Hereinafter, these commands are represented by ACT, WR, RD, PRE, and REF. Furthermore, determining whether or not the addresses are the same is based on the bank address. In other words, the addresses below the bank address are not considered. It short, for convenience, the number of banks is eight, however the number of banks may vary depending on design.

A test pattern of ACT (BANK1)→RD (BANK1)→WR (BANK2) is different from a test pattern of ACT (BANK1) →RD (BANK1)→WR (BANK3), where banks in parentheses indicate a bank address and each command before parentheses indicates a command for a corresponding address. This is because the banks BANK2, BANK3 written by write commands WR are different from each other. Similarly, a test pattern of ACT (BANK7)→PRE (BANK0) →RD (BANK7) is different from a test pattern of ACT (BANK7)→REF (BANK0)→WR (BANK7). This is because their second commands are different. The second command of the former test pattern is a precharge command (PRE) for a bank0, and the second command of the latter test pattern is a refresh command (REF) for the bank0.

FIG. 1 is a block diagram illustrating a test pattern generator 100 in accordance with an embodiment of the present invention.

Referring to FIG. 1, the test pattern generator 100 may include a random command address generator 110, a pattern storage circuit 120, an address converter 130, a history storage circuit 140, and a controller 150. The test pattern generator 100 is generally included in a test apparatus for testing a memory. However, when a memory controller has a function for testing a memory, the test pattern generator 100 may be included in the memory controller. When a memory has a self-test function, such as built-in self-test (BIST), the test pattern generator 100 may be included in the memory.

The random command address generator 110 may randomly generate a command CMD[T] and a bank address BA[T]. In other words, the random command address generator 110 may generate a combination of the command CMD[T] and the bank address BA[T]. The random command address generator 110 may operate in response to a generation signal GEN and a state update signal UPDATE_STATE. The random command address generator 110 may randomly generate the command CMD[T] and the bank address BA[T]. The command CMD[T] and the bank address BA[T] may be issued in the current state upon activation of the generation signal GEN. Upon activation of the state update signal UPDATE_STATE, the random command address generator 110 may update the state that it has generated and issued a command CMD[T] and a bank address BA[T]. In FIG. 1 "[T]" the command CMD[T] and the bank address BA[T] may represent the command and the bank address that are currently generated by the random command address generator 110, i.e., at a current state (or time) T.

The pattern storage circuit 120 may receive and store the command CMD[T] and the bank address BA[T] that are generated at a current state (or time) T by the random command address generator 110. A command CMD[T-1] and a bank address BA[T-1] may represent the command and bank address that are stored by the pattern storage circuit 120 at a previous state (T-1). A command CMD[T-2] and a bank address BA[T-2] may represent the command and bank address that are stored by the pattern storage circuit 120 at a previous state (T-2). The pattern storage circuit 120 may operate in response to a store signal STORE. The pattern storage circuit 120 may receive and store the command CMD[T] and the bank address BA[T] that are generated by the random command address generator 110 whenever the store signal STORE is activated. Whenever the store signal STORE is activated three times, combinations of three consecutive commands and three consecutive bank addresses stored in the pattern storage circuit 120 may be classified as an issue target, that is, a target to be issued to a memory. The combinations of the commands and the bank addresses classified as an issue target may be stored in the pattern storage circuit 120 or may be stored in a separate circuit.

The address converter 130 may convert combinations of three commands CMD[T-2], CMD[T-1], and CMD[T] and three bank addresses BA[T-2], BA[T-1], and BA[T] into a three-dimensional address (ADD[0], ADD[1], ADD[2]), respectively. The address converter 130 may convert the command CMD[T-2] and the bank address BA[T-2] into an address ADD[0] in a first axis, convert the command CMD[T-1] and the bank address BA[T-1] into an address ADD[1] in a second axis, and convert the command CMD[T] and the bank address BA[T] into an address ADD[2] in a third axis.

The address converter 130 may perform an address conversion operation to generate another address ADD when one among the commands CMD and the bank addresses BA is different. For example, there may be 40 different address combinations of five types of commands and eight bank addresses. The total number of possible three-dimensional addresses ADD[0], ADD[1], and ADD[2] may be 64000 (40*40*40=64000).

To be specific, the addresses (ADD[0], ADD[1], ADD[2]) in the first to third axes may be converted based on the following rules (when the addresses are expressed in decimal).

$ACT(i)=0*8+i$ (where $i$ is a bank indicated by a bank address)

$WR(i)=1*8+i$ $RD(i)=2*8+i$ $PRE(i)=3*8+i$ $REF(i)=4*8+i$

For example, when combinations of the commands CMD[T-2], CMD[T-1], and CMD[T] and the bank addresses BA[T-2], BA[T-1], and BA[T] are ACT(BANK1)→RD (BANK1)→WR(BANK3), ADD[0]=0*8+1=1, and ADD[1] =2*8+1=17, and ADD[2]=1*8+3=11.

The history storage circuit 140 may be accessed based on the three-dimensional addresses (ADD[0], ADD[1], ADD

[2]). The history storage circuit 140 may store information regarding "hit" and "no hit" in the accessed area. Herein, the "hit" may represent that the combinations of the commands CMD[T−2], CMD[T−1], and CMD[T] and the bank addresses BA[T−2], BA[T−1] and BA[T] which correspond to the three-dimensional addresses (ADD[0], ADD[1], ADD[2]) are already tested. The "no hit" may represent that the combinations of the commands CMD[T−2], CMD[T−1], and CMD[T] and the bank addresses BA[T−2], BA[T−1], and BA[T] which correspond to the three-dimensional addresses (ADD[0], ADD[1], ADD[2]) are not yet tested. A one-bit data may be stored in the area accessed based on the three-dimensional addresses (ADD[0], ADD[1], ADD[2]) in the history storage circuit 140. When the one-bit data has a value of '1', it may indicate hit. When the one-bit data has a value of '0', it may indicate no hit. Also, the data of an area that is accessed after the access to the history storage circuit 140 may be '1'.

Figure 2:
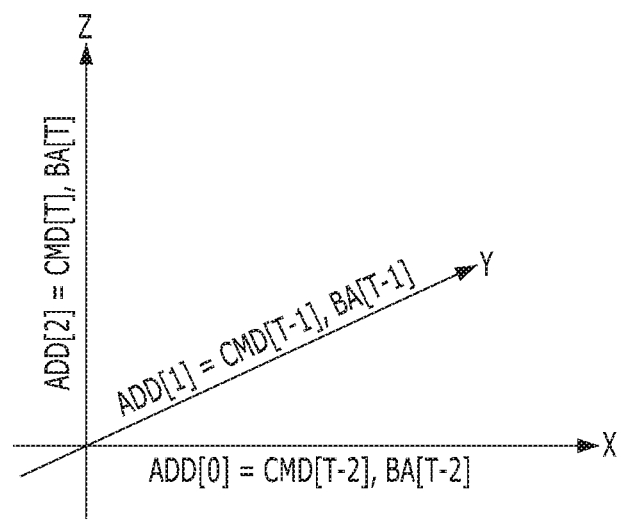
FIG. 2 illustrates a structure of a history storage circuit 140.

FIG. 2 illustrates a structure of the history storage circuit 140. It may be understood that the history storage circuit 140 includes a three-dimensional space of an X axis that is determined based on the first-axis address ADD[0] corresponding to the command CMD[T−2] and the bank address BA[T−2], a Y axis that is determined based on the second-axis address ADD[1] corresponding to the command CMD[T−1] and the bank address BA[T−1], and a Z axis that is determined based on the third-axis address ADD[2] corresponding to the command CMD[T] and the bank address BA[T]. Also, it may be understood that a one-bit data may be stored in an area corresponding to the determined X, Y and Z coordinates. When the stored one-bit data is '1', it may indicate hit. When the stored one-bit data is '0', it may indicate no hit. In other words, it may be understood that hit history is stored as a three-dimensional Boolean-type variable. FIG. 2 is a conceptual illustration of the structure of the history storage circuit 140, and it is not necessary that the storage areas of the history storage circuit 140 are actually formed in three dimensions. The history storage circuit 140 may be formed in any form as long as it has a structure in which one-bit data is accessed based on the three-dimensional address (ADD[0], ADD[1], ADD[2]).

The controller 150 may generate the generation signal GEN, the state update signal UPDATA_STATE, and the store signal STORE to control the overall operation of the test pattern generator 100.

FIG. 3 is a flowchart illustrating an operation of the test pattern generator 100 of FIG. 1.

Referring to FIG. 3, the random command address generator 110 may generate the command CMD[T−2] and the bank address BA[T−2] in step S301. The random command address generator 110 may generate the command CMD[T−2] and the bank address BA[T−2] under the control of the controller 150 activating the generation signal GEN. When the command CMD[T−2] and the bank address BA[T−2] are generated, the controller 150 may activate the store signal STORE and control the pattern storage circuit 120 to store the command CMD[T−2] and the bank address BA[T−2]. Further, the controller 150 may activate the state update signal UPDATE_STATE and control the random command address generator 110 to update the state that the command CMD[T−2] and the bank address BA[T−2] are issued.

The random command address generator 110 may generate the command CMD[T−1] and the bank address BA[T−1] in step S303. The random command address generator 110 may generate the command CMD[T−1] and the bank address BA[T−1] under the control of the controller 150 activating the generation signal GEN. When the command CMD[T−1] and the bank address BA[T−1] are generated, the controller 150 may activate the store signal STORE and control the pattern storage circuit 120 to store the command CMD[T−1] and the bank address BA[T−1]. Further, the controller 150 may activate the state update signal UPDATE_STATE and control the random command address generator 110 to update the state that the command CMD[T−1] and the bank address BA[T−1] are issued.

Subsequently, the random command address generator 110 may generate the command CMD[T] and the bank address BA[T] in step S305. The random command address generator 110 may generate the command CMD[T] and the bank address BA[T] under the control of the controller 150 activating the generation signal GEN.

Subsequently, the address converter 130 may convert the command CMD[T−2] and the bank address BA[T−2] into the first-axis address ADD[0], convert the command CMD[T−1] and the bank address BA[T−1] into the second-axis address ADD[1], and convert the command CMD[T] and the bank address BA[T] into the third-axis address ADD[2] in step S307.

The history storage circuit 140 may be accessed based on the three-dimensional addresses (ADD[0], ADD[1], ADD[2]) that are converted by the address converter 130 in step S309.

When a data of '1' is stored in the area accessed based on the three-dimensional addresses (ADD[0], ADD[1], ADD[2]) in the history storage circuit 140, that is, in the case of a hit ("HIT" in the step S309), it may represent that the combinations of the commands CMD[T−2], CMD[T−1], and CMD[T] and the bank addresses BA[T−2], BA[T−1], and BA[T] are already tested. Therefore, the command CMD[T] and the bank address BA[T] may be generated again by the random command address generator 110 in the step S305. Then the steps S307 and S309 may be performed again. Although not illustrated the figure, in the case of a "HIT", when there is no applicable command and bank address other than the currently generated command CMD[T] and the bank address BA[T] on the status, the steps S305, S307, and 309 may not be repeated and the logic flow goes to step S311.

When a data of '0' is stored in the area accessed based on the three-dimensional addresses (ADD[0], ADD[1], ADD[2]) in the history storage circuit 140, that is, in the case of a no hit ("NO HIT" in the step S309), it may represent that the combinations of the commands CMD[T−2], CMD[T−1], and CMD[T] and the bank addresses BA[T−2], BA[T−1], and BA[T] are not yet tested. Therefore, the combinations of the commands CMD[T−2], CMD[T−1], and CMD[T] and the bank addresses BA[T−2], BA[T−1], and BA[T] may be classified as an issue target in step S311. This may be performed as the controller 150 activates the store signal STORE, and classifies the combinations of the commands CMD[T−2], CMD[T−1], and CMD[T] and the bank addresses BA[T−2], BA[T−1], and BA[T] as issue targets. The command CMD[T] and the bank address BA[T] are stored in the pattern storage circuit 120 in response to the activated store signal STORE at the same time. The combinations of the commands and the bank addresses may be classified as issue targets since the store signal STORE is activated three times. Also, the controller 150 may activate the state update signal UPDATA_STATE and control the random command address generator 110 to update the state that the command CMD[T] and the bank address BA[T] are issued.

As described above, the test pattern generator 100 may check a history representing whether or not the combinations of the three consecutive commands CMD[T−2], CMD[T−1], and CMD[T] and the three consecutive bank addresses BA[T−2], BA[T−1], and BA[T] are already tested. In the case of a hit, the test pattern generator 100 may generate the third command CMD[T] and the third bank address BA[T] again. In the case of a no hit, the test pattern generator 100 may classify the combinations of the three consecutive commands CMD[T−2], CMD[T−1], and CMD[T] and the three consecutive bank addresses BA[T−2], BA[T−1], and BA[T] as issue targets (which are to be tested). This operation may be able to improve the efficiency of the test by preventing the same test pattern from being repeatedly tested.

According to an embodiment of the present invention, a test pattern generator may have decreased test pattern overlapping.

Particularly, for the sake of convenience in description, in the above embodiments there are five types of commands and eight banks in a memory. However, it is obvious to those skilled in the art that the types of commands and the number of banks used in an actual memory may be less than or greater than the above example.

While the present invention has been described with respect to the specific embodiments, it will be apparent to those skilled in the art that various changes and modifications may be made without departing from the spirit and scope of the invention as defined in the following claims.

What is claimed is:

1. A test pattern generator comprising:
   a random command address generator configured to generate N combinations, each combination of a command and an address, where N is an integer greater than or equal to 2;
   an address converter configured to convert the N combinations into first to Nth-axis addresses;
   a history storage circuit which is accessed based on the first to Nth-axis addresses; and
   a controller configured to classify the N combinations as issue targets, when an area in the history storage circuit, which is accessed based on the first to Nth-axis addresses, indicates a value of no hit,
   wherein a value of each of the first to Nth-axis addresses is determined by a command and an address included in a corresponding combination among the N combinations.

2. The test pattern generator of claim 1, wherein, when the area indicates a value of hit,
   the controller controls the random command address generator to change the N combinations.

3. The test pattern generator of claim 1, wherein the address includes a bank address.

4. The test pattern generator of claim 3, wherein, when at least one between a type of a command and the bank address for one of the N combinations is different, and
   Wherein the address converter performs the conversion operation.

5. The test pattern generator of claim 1, wherein a one-bit data is stored in the area, and
   wherein a logic value of the one-bit data indicates one of a hit and a no hit.

6. A test pattern generator comprising:
   a random command address generator configured to generate combinations, each combination being a command and a bank address, the combinations including first, second and third combinations;
   a pattern storage circuit configured to store the combinations;
   an address converter configured to convert the first combination into a first-axis address, convert the second combination into a second-axis address, and convert the third combination into a third-axis address;
   a history storage circuit which is accessed based on the first-axis address, the second-axis address, and the third-axis address; and
   a controller configured to control the first to third combinations to be stored in the pattern storage circuit as issue targets when an area in the history storage circuit, which is accessed based on the first-axis address, the second-axis address, and the third-axis address indicates a value of no hit,
   wherein a value of the first-axis address is determined by a command and an address included in the first combination, a value of the second-axis address is determined by a command and an address included in the second combination and a value of the third-axis address is determined by a command and an address included in the third combination.

7. The test pattern generator of claim 6, wherein, when the area indicates a value of hit,
   the controller controls the random command address generator to change the first to third command and bank address combinations.

8. The test pattern generator of claim 7, wherein the controller controls the random command address generator to generate the third combination again to change the first to third combinations.

9. The test pattern generator of claim 6, wherein, when at least one of a type of a command and a bank address for one of the combinations is different,
   the address converter performs the conversion operation.

10. The test pattern generator of claim 6, wherein a one-bit data is stored in the area, and
    wherein a logic value of the one-bit data indicates one of a hit and a no hit.

11. A method for generating a test pattern, the method comprising:
    randomly generating N combinations, each combination being a command and an address, where N is an integer greater than or equal to 2;
    converting the N combinations into first to Nth-axis addresses;
    accessing a history storage circuit based on the first to Nth-axis addresses;
    detecting whether an area in the history storage circuit, which is accessed based on the first to Nth-axis addresses, indicates a value of no hit; and
    classifying the N combinations as issue targets in response to the detection of no hit,
    wherein a value of each of the first to Nth-axis addresses is determined by a command and an address included in a corresponding combination among the N combinations.

12. The method of claim 11, further comprising: after the classifying of the N combinations as the issue targets:
    randomly generating N new combinations;
    converting the N new combinations into a new N-dimensional address;
    detecting whether an area in the history storage circuit, which is accessed based on the new N-dimensional address, indicates a value of no hit; and
    changing the N new command and bank address combinations in response to the detection of a value of hit.

13. A method for generating a test pattern, the method comprising:

randomly generating N combinations, each combination being a command and a bank address, the N combinations including first, second and third combinations, where N is an integer greater than or equal to 2;

converting the N combinations into first to Nth-axis addresses;

accessing a history storage circuit based on the first to Nth-axis addresses;

detecting whether an area in the history storage circuit, which is accessed based on the first to Nth-axis addresses, indicates a value of no hit; and changing the N combinations in response to the detection of a value of hit, wherein a value of each of the first to Nth-axis addresses is determined by a command and an address included in a corresponding combination among the N combinations.

14. The method of claim 13, wherein the changing of the N combinations includes:

randomly generating one command and bank address combination again among the N combinations.

\* \* \* \* \*